US010302282B2

(12) United States Patent
Volpato et al.

(10) Patent No.: US 10,302,282 B2
(45) Date of Patent: May 28, 2019

(54) SUPPORT STRUCTURE FOR LIGHTING DEVICES, CORRESPONDING LIGHTING DEVICE AND METHOD

(71) Applicant: OSRAM GmbH, Munich (DE)

(72) Inventors: Luca Volpato, Preganziol (IT); Alessio Griffoni, Fossò (IT)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 15/839,891

(22) Filed: Dec. 13, 2017

(65) Prior Publication Data

US 2018/0163955 A1 Jun. 14, 2018

(30) Foreign Application Priority Data

Dec. 14, 2016 (IT) .................. 102016000126187

(51) Int. Cl.
*F21S 4/22* (2016.01)
*H05K 1/09* (2006.01)
(Continued)

(52) U.S. Cl.
CPC .............. *F21V 21/005* (2013.01); *F21S 4/22* (2016.01); *F21V 21/14* (2013.01); *H05B 33/089* (2013.01);
(Continued)

(58) Field of Classification Search
None
See application file for complete search history.

(56) References Cited

U.S. PATENT DOCUMENTS

2014/0175993 A1 6/2014 Tischler et al.
2015/0325755 A1 11/2015 Speer et al.
(Continued)

FOREIGN PATENT DOCUMENTS

EP 2615700 A1 7/2013
EP 3081845 A1 10/2016

OTHER PUBLICATIONS

Italian Search Report based on application No. 201600126187 (8 pages) dated Sep. 27, 2017 (Reference Purpose Only).

*Primary Examiner* — Mariceli Santiago
(74) *Attorney, Agent, or Firm* — Viering Jentschura & Partner MBB

(57) ABSTRACT

A support structure for electrically-powered lighting devices (e.g. LED modules) includes: an elongated laminar substrate having first and second mutually opposed surfaces, a layer of electrically-conductive material, e.g. copper, on the first surface of the laminar substrate, the layer including etching forming first electrically-conductive formations extending along the first surface of the laminar substrate, a distribution of electrically-conductive areas on the second surface of the laminar substrate, the distribution including electrically-conductive areas formed by means of etching and distributed with a constant separation pitch along the second surface of the laminar substrate, electrically-conductive vias extending through the laminar substrate to connect the first electrically-conductive formations and the electrically-conductive areas in said distribution, and a network of second electrically-conductive formations including electrically-conductive ink deposited (e.g. printed) on the second surface of the laminar substrate, with second electrically-conductive formations in said network being electrically connected with the electrically-conductive areas in said distribution.

12 Claims, 8 Drawing Sheets

(51) Int. Cl.
*H05K 1/11* (2006.01)
*H05K 1/18* (2006.01)
*F21V 21/14* (2006.01)
*H05B 33/08* (2006.01)
*F21V 21/005* (2006.01)

(52) U.S. Cl.
CPC ..... *H05B 33/0815* (2013.01); *H05B 33/0821* (2013.01); *H05K 1/095* (2013.01); *H05K 1/113* (2013.01); *H05K 1/189* (2013.01); *H05K 2201/0391* (2013.01); *H05K 2201/10106* (2013.01)

(56) References Cited

U.S. PATENT DOCUMENTS

2016/0270163 A1  9/2016  Hu et al.
2016/0334090 A1  11/2016  Zanotto et al.

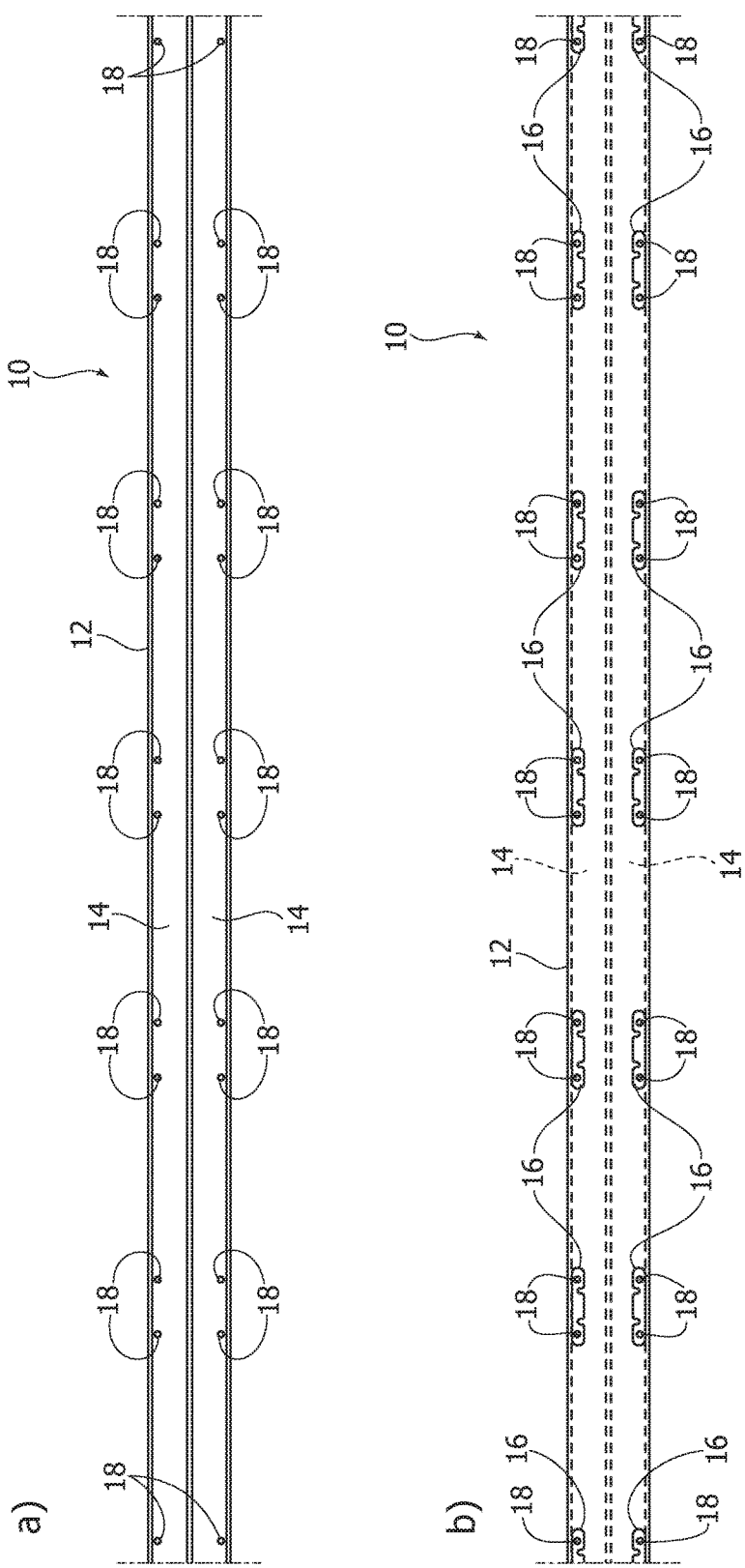

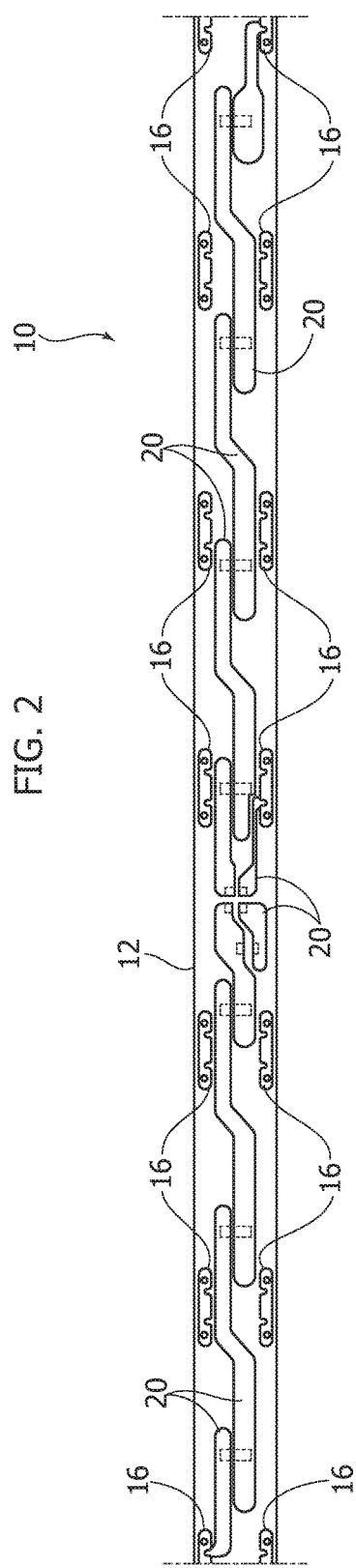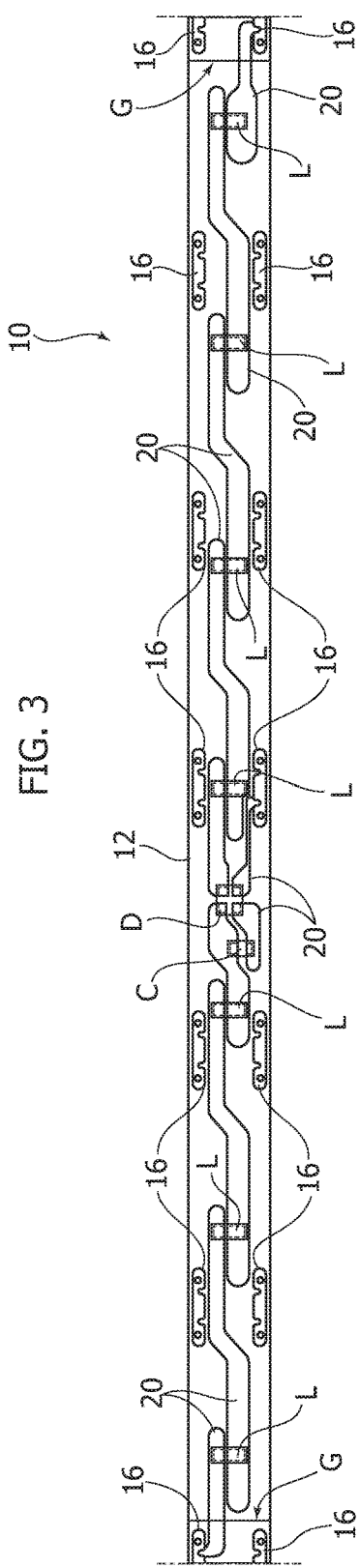

SUPPORT STRUCTURE FOR LIGHTING DEVICES, CORRESPONDING LIGHTING DEVICE AND METHOD

CROSS-REFERENCE TO RELATED APPLICATION

This application claims priority to Italian Patent Application Serial No. 102016000126187, which was filed on Dec. 14, 2016, and is incorporated herein by reference in its entirety.

TECHNICAL FIELD

The present description relates to lighting devices.

One or more embodiments may refer e.g. to support structures which may be used for lighting devices employing electrically-powered light radiation sources, e.g. solid-state light radiation sources such as LED sources.

BACKGROUND

In the field of lighting technology, and particularly in the lighting technology based on the use of solid-state light radiation sources, such as LED sources, the need is felt to be able to introduce new products with faster reaction times.

At the same time, customers are increasingly asking for customized devices, e.g. customized LED modules, both as regards general lighting and as regards signage applications.

In this scenario, whenever the need arises for a customized device, a dedicated layout is to be designed.

This approach, however, leads to an undesirable proliferation of different products, with consequent management difficulties due e.g. to the proliferation of the ID codes of the single products: this problem, featuring codes identifying products manufactured in very small volumes, or sometimes even only once or twice, may appear e.g. when conventional etching techniques are resorted to in order to produce the circuits.

The etching techniques traditionally adopted to manufacture Printed Circuit Boards (PCBs), e.g. for electronics applications, may involve longer lead times than presently required on the market.

At least theoretically, in order to reduce the so-called time to market, i.e. the time required for the initial marketing of new products, and in order to satisfy at least the first delivery requests, it is possible to resort to printed circuits manufactured in small volumes, e.g. by using rapid prototyping techniques.

This procedure is cumbersome (rapid prototyping has high costs) and it is difficult to use if prototyping is to be followed by high production volumes, e.g. because a different printed circuit may require a new qualification/certification of the product.

In the case e.g. of linear and flexible LED modules, this approach is hardly compatible with the production of continuous LED stripes, e.g. by means of reel-to-reel techniques, because rapid prototyping is adapted to be performed mainly by operating on panels.

Theoretically, it is also possible to produce elongated flexible stripes of a certain length by splicing a plurality of pieces obtained from a panel; this approach, however, may be critical as regards the reliability of the junctions.

The lead time may be shorter in the case of Printed Circuit Boards (PCBs) of the Single-Side (SS) type, i.e. wherein the electrically-conductive lines are implemented only on one side of the substrate, or in the case of Flexible Printed Circuits (FPCs).

A possible solution for decreasing the lead time of new products may therefore involve the exclusive use of this type of printed circuits.

The use of conventional flexible LED stripes may however entail a reduction of the available power, and/or a reduction of the maximum available length. This is due to the fact that, in a Single-Side module, the electrically-conductive lines (tracks), e.g. copper lines, carrying the power supply along the modules are not available on the back (bottom) layer of the substrate.

Another possible solution for satisfying the requirements of reaction time to market and/or of high customizability may consist in using printed circuit boards employing electrically-conductive inks, adapted to be deposited by means of ink-jet printers or stencils, in case of screen printing techniques.

These solutions may hardly be used, however, in mid-high power applications, or for rather long stripes: indeed, electrically-conductive inks have a lower conductivity than metal materials such as copper, and have lower application thicknesses.

For these reasons, the use of electrically-conductive inks is primarily limited to low-power or decorative applications.

SUMMARY

One or more embodiments aim at contributing to meet the previously described requirements, by overcoming the previously described drawbacks.

According to one or more embodiments, said object may be achieved thanks to a support structure having the features set forth in the claims that follow.

One or more embodiments may also concern a corresponding lighting device, as well as a corresponding method.

The claims are an integral part of the technical teachings provided herein with reference to the embodiments.

One or more embodiments may provide a hybrid modular structure, adapted to combine a standard Double-Side (DS) etching process by means of deposition of electrically-conductive inks, adapted to be implemented, e.g. by screen printing, in such a way as to originate thinner electrically-conductive formations, or by means of other deposition techniques.

One or more embodiments may be used for a wide range of applications (linear or area lighting, signage etc.), the possibility being given of applications e.g. in LED modules driven both by constant current and constant voltage.

One or more embodiments may be used for both rigid and flexible printed circuits.

One or more embodiments may be employed in the production of linear flexible LED module, e.g. by means of reel-to-reel techniques.

One or more embodiments may lead to achieving one or more of the following advantages:
  reduction of reaction times linked to the request, by the users, of new and optionally customized products, with a corresponding reduction of the time to market thereof; indeed, the lead time for a new stencil tool for the screen printing of electrically-conductive ink may require a few days, while the production of totally new or modified layouts entirely implemented by etching processes on metal materials, e.g. copper, may require several weeks;

adaptability to both rigid and flexible linear modules, the possibility being given to employ reel-to-reel processes;

applicability to both linear and area lighting modules;

possibility of implementing modules (e.g. linear LED modules) via a modular approach, the possibility being given of using, in order to implement such modules, a wide range of different LED types for an equally wide range of selectable lengths for the Single Electrical Units (SEUs);

lower complexity in managing different products, e.g. as regards management codes;

possibility of using small production batches of customized products, without implementing complex processes for the development of dedicated layouts and/or new tools, optionally involving the PCB/FPC suppliers;

possibility of combining a high design flexibility (supported by conductive ink deposition processes) with the high capability of conducting electrical currents guaranteed by metal (e.g. copper) lines or tracks, implemented by means of a standard etching process, therefore without limitations as regards maximum length or maximum wattage for lighting modules;

possibility of implementing linear modules or (e.g. LED) stripes which are compatible with connectors which may contact the module both on the front or upper side or on the back or bottom side, the possibility being given of using connectors having e.g. either sliding contacts (in the case of bare modules) or perforating contacts (in the case of IP protected modules, surrounded by a protective polymer material).

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1, including two portions respectively denoted as a) and b), exemplifies a structure according to one or more embodiments, FIGS. 2 to 7 exemplify various usages of one or more embodiments, FIG. 8 further illustrates usages of embodiments.

DESCRIPTION

Figure 4:
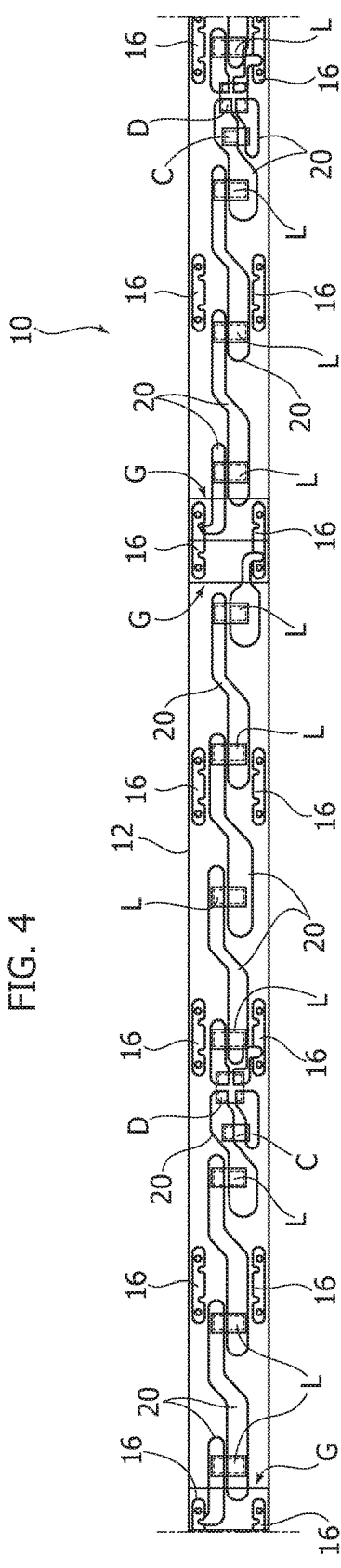

In the following description, various specific details are given to provide a thorough understanding of various exemplary embodiments according to the present description. The embodiments may be practiced without one or several specific details, or with other methods, components, materials, etc. In other instances, well-known structures, materials, or operations are not shown or described in detail in order to avoid obscuring various aspects of the embodiments.

Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings provided herein are for convenience only, and therefore do not interpret the extent of protection or scope of the embodiments.

In the Figures, reference 10 generally denotes a support structure which may be used to implement lighting devices.

In one or more embodiments, said lighting devices employ electrically-powered light-radiation sources such as e.g. solid-state light radiation sources, for example LED sources.

In one or more embodiments, the support structure 10 may include a substrate 12 of electrically insulating material having e.g. an elongated, ribbon-like, optionally flexible shape. As far as the present case is concerned, substrate 12 (and therefore support structure 10 and a lighting device implemented by making use of said support structure) may be considered as having indefinite length, adapted to be cut to length according to the application and usage needs.

In one or more embodiments, substrate 12 may feature:

on a first surface, formations such as electrically-conductive lines or tracks 14, extending along the length of structure 10, e.g. acting as power supply lines (e.g. "hot" line and ground line): see portion a) of FIG. 1, and on the other surface, e.g. at the longitudinal edges of support 12, lands 16 which are arranged, e.g. pairwise, with a constant separation pitch distribution along the length of substrate 12: see portion b) of FIG. 1.

In one or more embodiments, electrically-conductive vias may extend across substrate 12, being adapted to establish a connection between formations 14 and lands 16.

As may be appreciated in a comparison of portions a) and b) of FIG. 1, in one or more embodiments the lands 16 may be arranged facing formations 14, arranged on the opposite side of substrate 12, so that each land 16 is electrically connected to a line 14 by means of one or more vias 18.

In this regard, it will be appreciated that:

the choice of implementing, on one surface of substrate 12, two formations including electrically-conductive lines 14 is presented herein by way of non-limiting example only: in one or more embodiments, as a matter of fact, a different number of lines 14 may be adopted (e.g. three or more lines), e.g. in order to achieve a selective distribution of power supply lengthwise of structure 10;

correspondingly, the choice of implementing two rows of lands 16 at the opposed longitudinal sides of substrate 12 is again presented herein by way of non-limiting example only: for example, if substrate 12 hosts a number of conductive lines 14 other than two (e.g. three or more), one or more embodiments may envisage the presence of a corresponding number of rows of lands 16 aligned lengthwise of substrate 12;

in the same way, the choice of arranging lands 16 in corresponding positions lengthwise of substrate 12 is to be considered as a non-limiting example only: in one or more embodiments, the lands 16 in each row may be arranged with a constant separation pitch, without being necessarily aligned (so to say "phased") transversally of substrate 12 with respect to the lands 16 provided in the other row(s), the connection of each land 16 to a line 14 on the opposite side of substrate 12, by means of a pair of electrically-conductive vias, is again to be considered by way of non-limiting example only; in one or more embodiments, the connection of one land 16 with a corresponding line 14 on the other side of substrate 12 may include any number of vias 18.

In one or more embodiments, the formations 14 may be implemented by etching (e.g. chemical or laser etching) a layer of electrically-conductive material (e.g. copper) applied onto substrate 12. In this way it is possible to obtain formations such as electrically-conductive lines or tracks 14 having the thickness required for achieving quite long structures 10 (and therefore corresponding lighting modules), without originating significant voltage drops due to the ohmic resistance of the electrically-conductive lines 14, the possibility being therefore given of supplying also rather cumbersome loads (e.g. light radiation sources L).

The lands 16 may be obtained by means of a corresponding technique, optionally providing a surface finish (e.g. of a silver-based material), the electrically-conductive lines 18 being implemented by perforating substrate 12 and achieving electrical contact with formations 14 and lands 16 according to currently employed processes.

A structure 10 as exemplified in FIG. 1 may have the function of a sort of fundamental component, adapted to be implemented and made available on the market by the current manufacturers of Printed Circuit Boards (PCBs), optionally Flexible Printed Circuits (FPCs).

In one or more embodiments, as exemplified in FIG. 2 and in the following FIGS., such a fundamental structure (which, as mentioned in the foregoing, is adapted to constitute a sort of standard component) is adapted to be customized according to specific application and usage needs by depositing, onto the surface of substrate 12 opposed to the surface hosting the formations 14, an electrically-conductive ink adapted to define a circuit layout 20 corresponding to the application and usage needs.

The electrically-conductive formations (lines) 20 are adapted to be implemented by applying electrically-conductive ink (e.g. ink embedding dispersed silver particles) within a wide range of arrangements, which may be selected and implemented in a very short time. For example, formations 20 may be implemented via stencil screen printing or ink-jet printing.

In one or more embodiments, it is therefore possible to implement, on the surface (e.g. the front or upper surface) of substrate 12 opposite the surface (back or bottom surface) hosting the formations 14, a network of electrically-conductive formations 20, the possibility being given of using lands 16 to establish an electrical (e.g. power supply) connection towards said network or layout 20 implemented by applying conductive ink.

In one or more embodiments, the connection may be established at lands 16 at the positions where the supply is to be implemented (hot line and ground line).

Although in the present example a single ribbon-like substrate 12 is envisaged, the solution according to one or more embodiments may be implemented (both as regards the etching of formations 14 and as regards the achievement of lands 16 and the application of electrically-conductive ink of network 20) on a plurality of substrates 12 placed side by side, connected with each other so as to obtain a reel (e.g. in a reel-to-reel process), the individual structures 10 being separated only in a subsequent step.

Optionally, the structures 10 may be separated after mounting thereon light radiation sources L and further optional components and/or electrical and electronic circuits associated thereto.

This may take place according to the criteria described in the following, e.g. the mounting being carried out via a soldering process followed by a functionality test.

It will be appreciated that also the test operations may be performed when the various individual structures 10 are still connected with each other in a reel or roll.

As may be seen e.g. in FIGS. 2 to 7, in one or more embodiments the regular distribution of lands 16 (with constant separation pitch) is the basis of a modular solution enabling the achievement of Single Electric Units (SEUs) the length whereof corresponds to the distance between two subsequent lands 16 or to a multiple thereof.

For example, the lands 16 may be arranged with a constant separation pitch, amounting e.g. to 25 mm (of course, such a value is merely exemplary and must not be construed as limiting the scope of the embodiment), the possibility being therefore given to obtain SEUs having lengths of e.g. 25 mm, 50 mm, 75 mm, etc.

For the electrical connection between lands 16 (connected to formations 14 through vias 18) and the electrically-conductive formations (e.g. a network of lines) 20 obtained by depositing electrically-conductive ink, various solutions may be resorted to.

Figure 13:
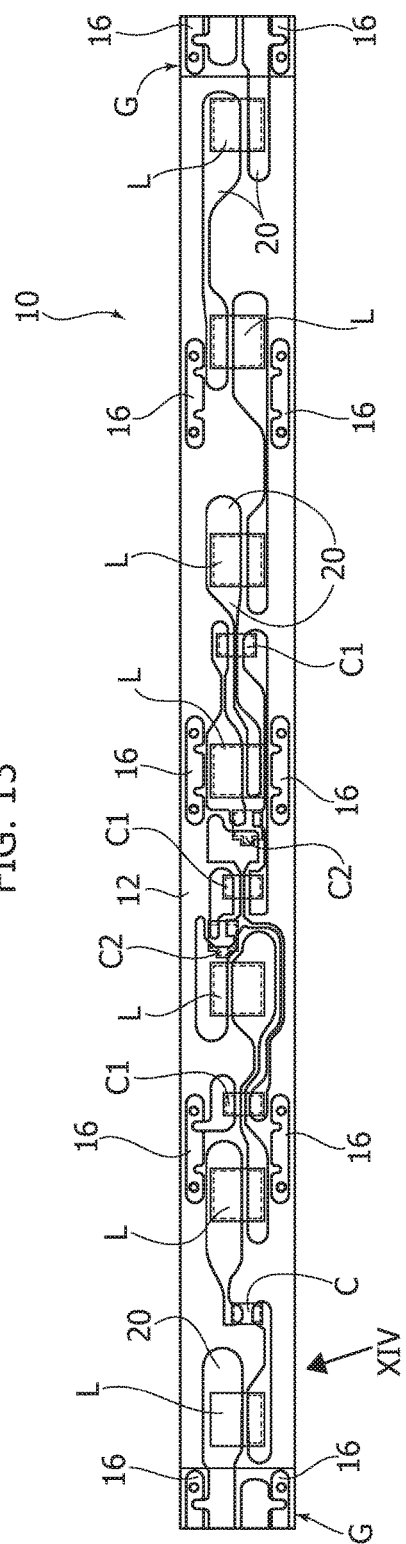
Figure 14:
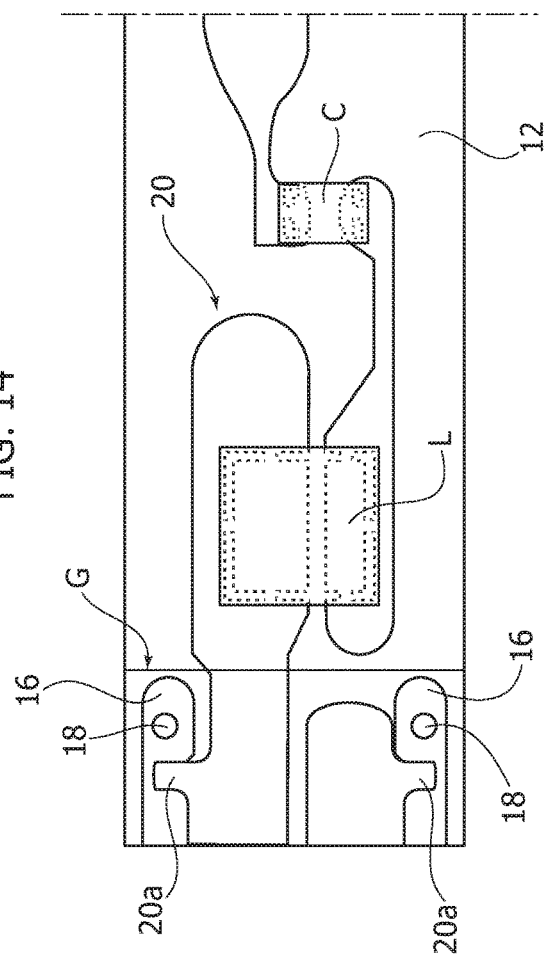
FIG. 14 shows, in a magnified scale, the portion of FIG. 10 denoted by arrow XIV, FIG. 15 exemplifies possible usages of one or more embodiments.
Figure 15:
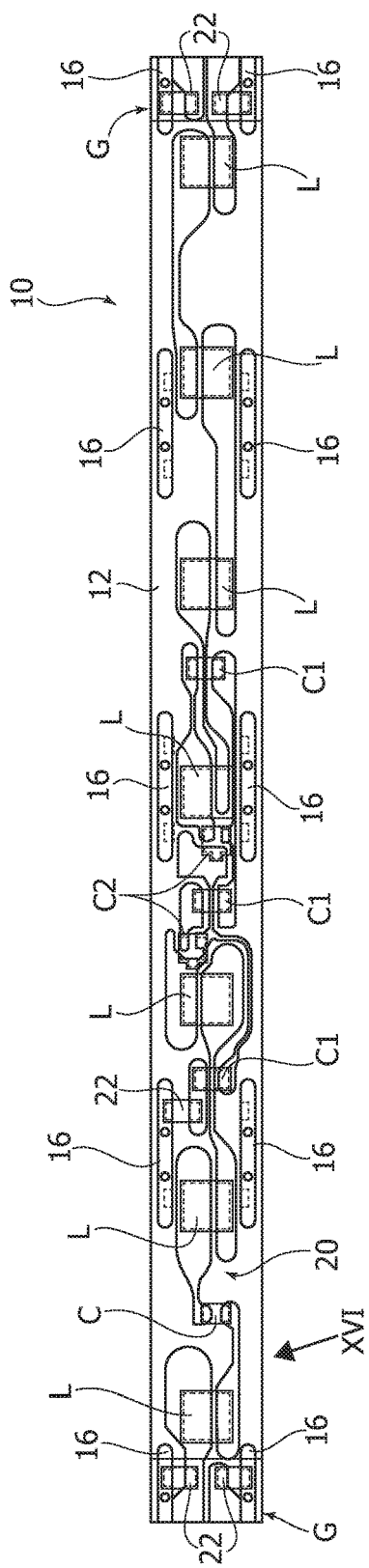
Figure 16:
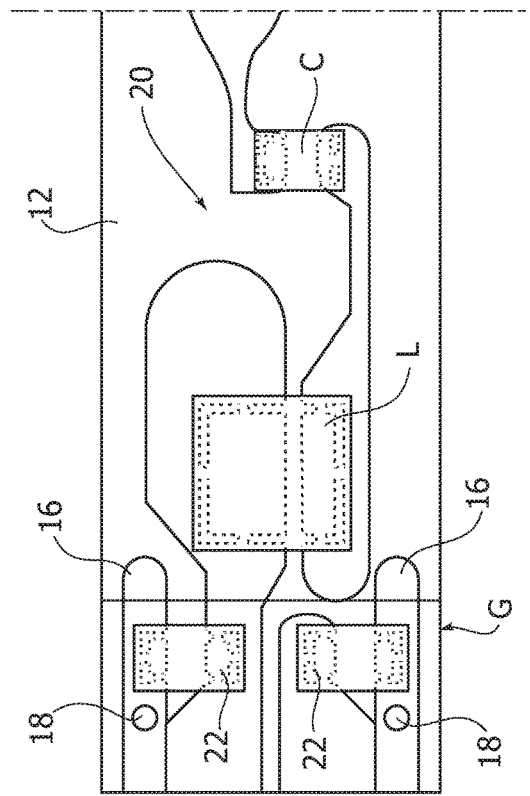
FIG. 16 shows, in a magnified scale, the portion of FIG. 10 denoted by arrow XVI.

For example, FIGS. 2 to 9 as well as FIGS. 13 and 14 show the possible use of an "overlap" joining technique, as the electrically-conductive ink of formations 20 is deposited (e.g. via screen printing or ink-jet printing) so as to cover the lands 16 with which an electrical connection must be established.

In one or more embodiments, the electrical connection between the etched material of lands 16 and the electrically-conductive ink of formations 20 may be achieved by means of the solution described in a patent application for Industrial Invention filed by the same Applicants on the same date.

Figure 9:
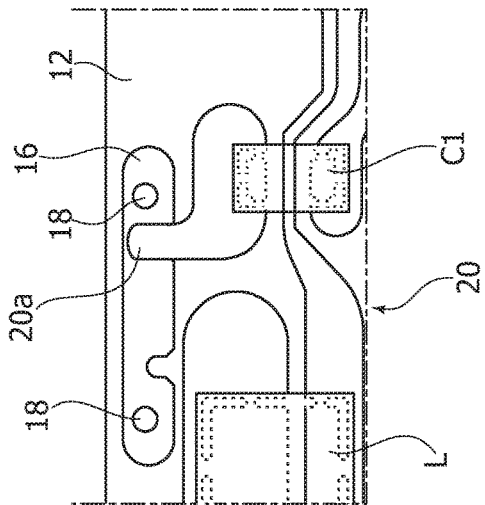
FIG. 9 shows, in a magnified scale, the portion of FIG. 8 denoted with arrow IX, FIG. 10 exemplifies possible usages of one or more embodiments.

For simplicity of representation, said possible overlap areas are explicitly denoted as 20a only in some of the FIGS., e.g. FIG. 9 or FIG. 14.

In one or more embodiments, the electrical connection between the etched material of lands 16 and the electrically-conductive ink of formations 20 may be achieved by bridge-like elements 22 such as e.g. SMD jumpers.

Also in this case, for simplicity of representation, said elements 22 are explicitly shown only in some of the Figures.

The choice of either solution (the optional possibility being given, in one or more embodiments, of using both solutions in different areas of structure 10) may be dictated by different factors, such as e.g. the electro-mechanical properties of the electrically-conductive ink, and/or the optional flexibility of structure 10, also taking into consideration the possible deformation directions expected in such a structure.

The comparison between FIG. 2 and FIG. 3 highlights the fact that, starting from a fundamental structure 10 as exemplified in the foregoing (substrate 12, with the formations 14 implemented on one side being connected, through the vias 18, with the lands 16 on the other side, the latter being in turn electrically connected to the network of lines obtained via ink deposition 20), it is possible to implement lighting devices by arranging (at respective areas and mounting lands provided in the lines 20 obtained by ink deposition) the light radiation sources L and optional further elements, such as e.g. electrical/electronic components and circuits adapted to cooperate with sources L.

FIG. 3 shows—by way of example—a solution wherein, along a certain length of structure 10 (corresponding to the length of a lighting module to be obtained) there may be arranged a certain number of sources L (e.g. seven sources L), while also mounting, onto lines 20 obtained via ink deposition, e.g. a driver/control circuit D and a component C, e.g. a resistor (for example a calibration resistor of control circuit D).

FIGS. 4 to 7 exemplify (of course by way of non-limiting example only) the possibility of taking advantage of the general modular arrangement offered by structure 10 in order to produce lighting modules having SEUs of different lengths (which may be separated from each other as a function of the application and usage needs).

Figure 5:
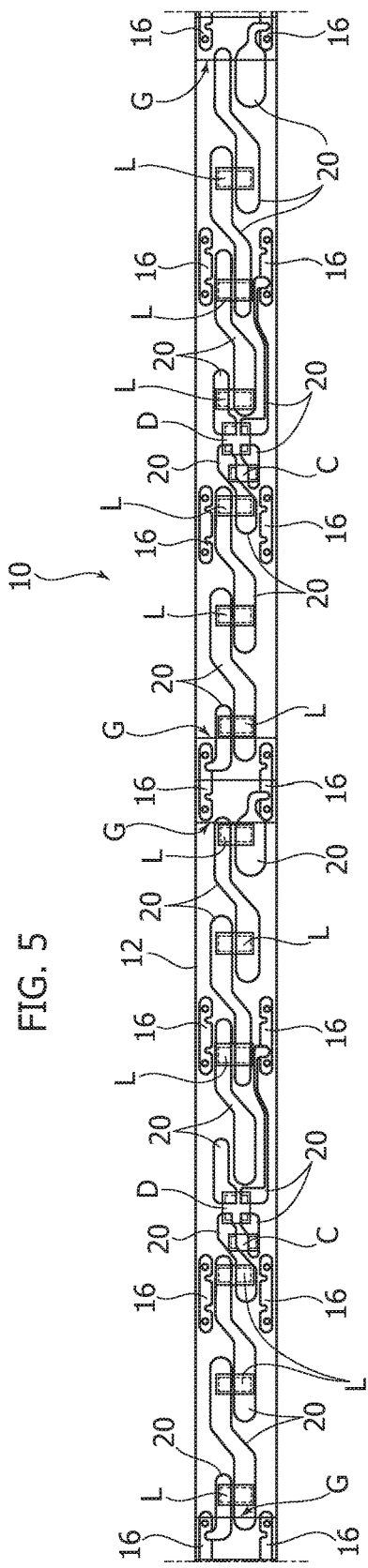
Figure 6:
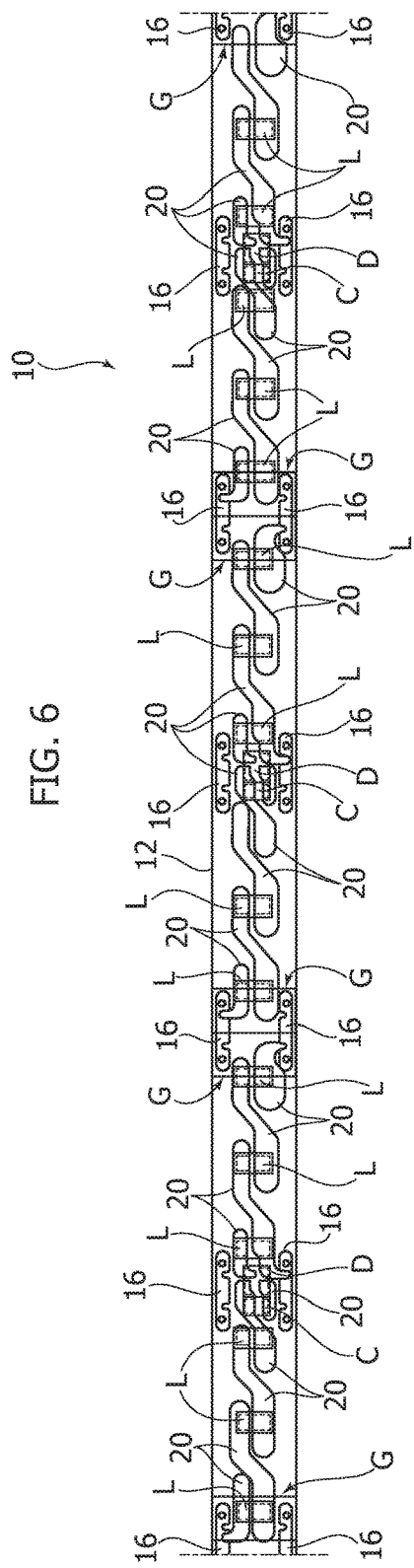
Figure 7:
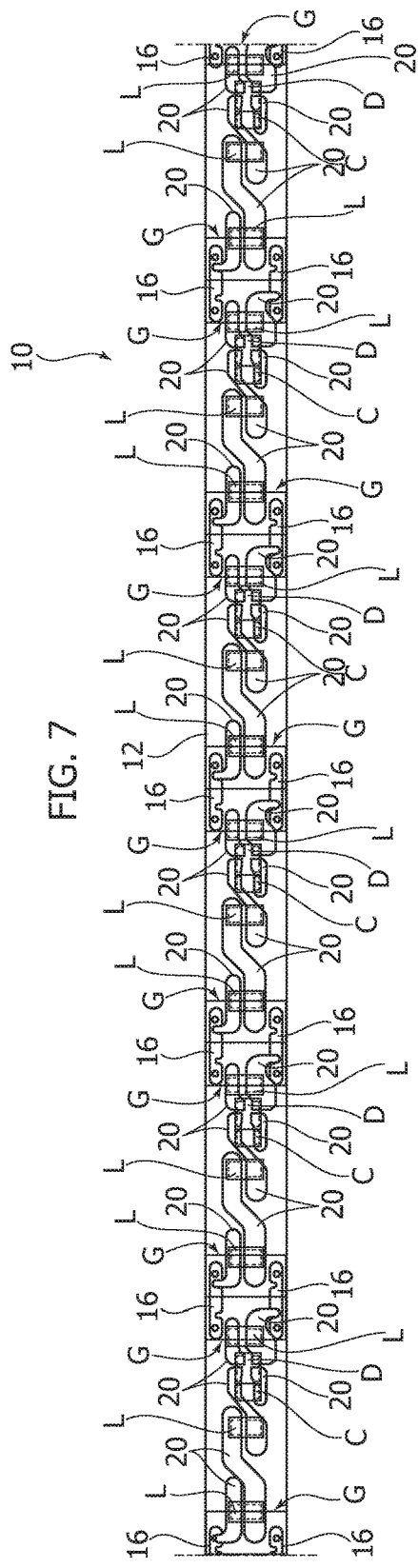

For example, while FIG. 3 may be seen as exemplifying a module including a single SEU having a length amounting e.g. to 150 mm and including seven LEDs L (therefore having a LED separation pitch approximately amounting to 21.4 mm), FIGS. 4 to 7 exemplify the possibility of implementing devices/modules having the following features:

FIG. 4: a SEU (on the left in the Figure) once again including seven LEDs, but having a length of 100 mm (and therefore a LED separation pitch of about 14.3 mm), FIG. 5: two SEUs (both visible in the Figure) each having a length of 75 mm and each including seven LEDs, i.e. having a LED separation pitch of about 10.7 mm, FIG. 6: a number of SEUs (whereof three are visible in the Figure) each having a length of 50 mm and each including six LEDs (i.e. having a LED separation pitch of about 8.3 mm), and FIG. 7: a number of SEUs (whereof six are visible in the Figure) each having a length of 25 mm and each including three LEDs, i.e. one again having a LED separation pitch of about 8.3 mm.

For example, the latter solution may be particularly suitable for 12 Volt or 24 Volt applications, e.g. in the case of double-chip LEDs in series.

Figure 8:
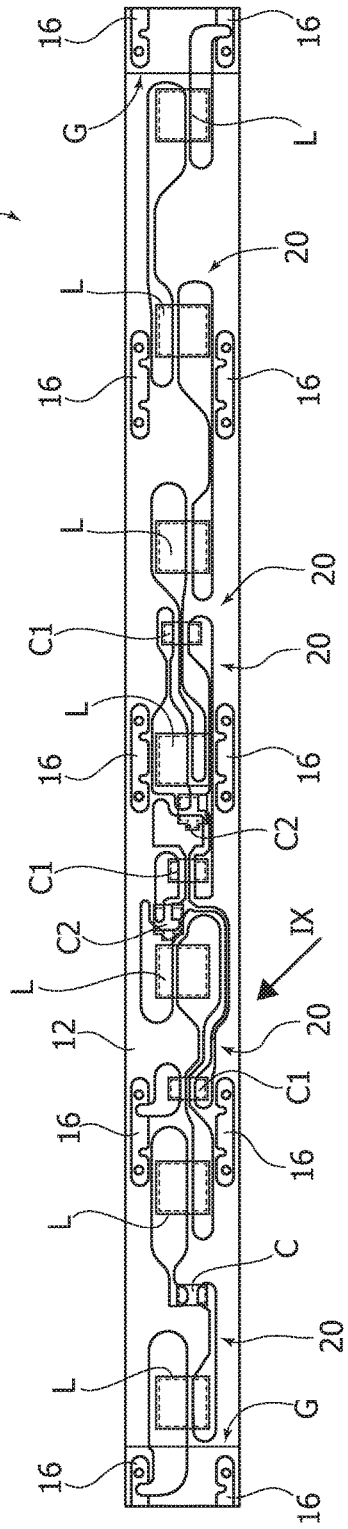

As previously mentioned, FIGS. 8 to 9 exemplify the possibility of achieving a connection between lands 16 and conductive formations 20 obtained by deposition of conductive ink by means of an overlap process (see e.g. the portion denoted as 20a in FIG. 9).

Figure 10:
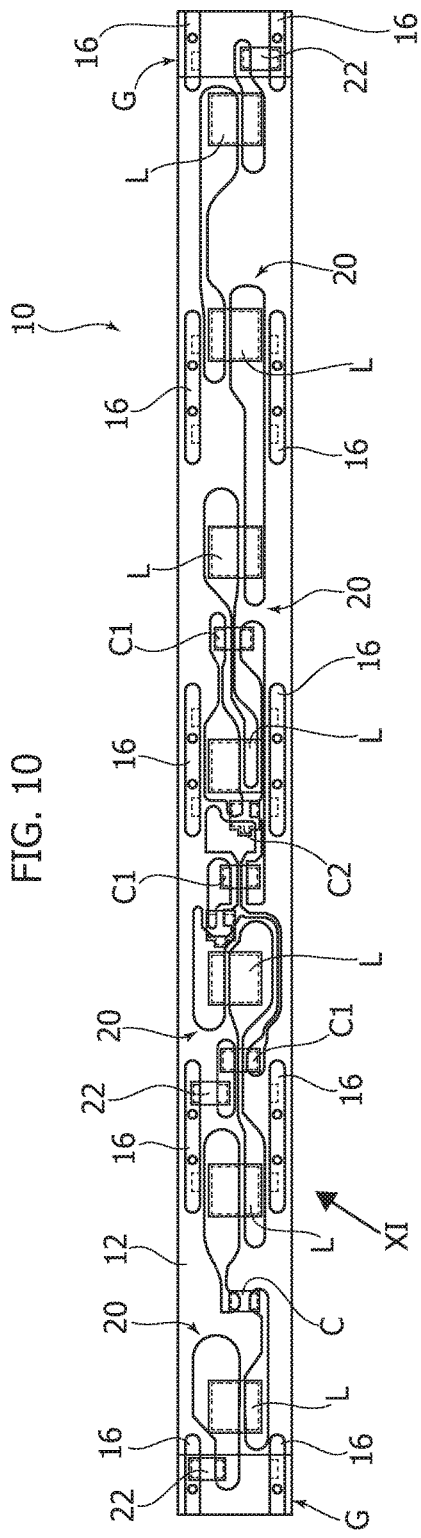
Figure 11:
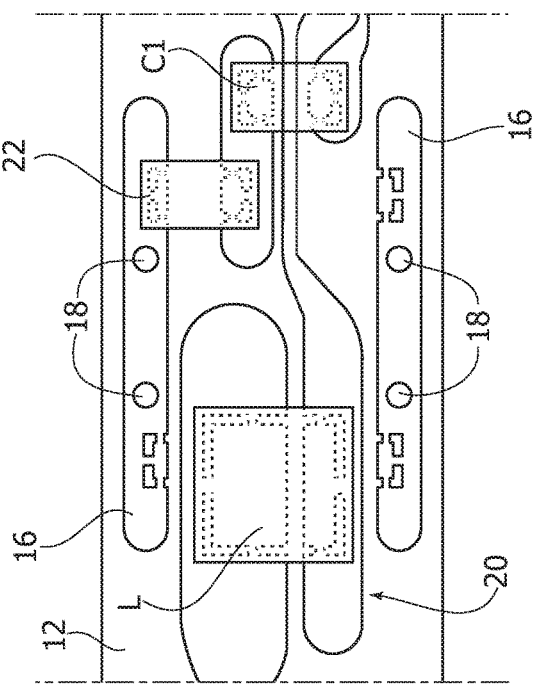
FIG. 11 shows, in a magnified scale, the portion of FIG. 10 denoted by arrow XI.

FIGS. 10 and 11 exemplify, in a way substantially corresponding to the FIGS. 8 and 9, the possibility of using, instead of overlap areas 20a, electrically-conductive jumpers 22 (e.g. zero-Ohm SMD components): in one or more embodiments, this takes advantage of the possibility of forming soldering pads (respectively of etched copper and deposited ink) for such jumpers 22 at the areas 16 and at the corresponding areas included in the formations 20.

FIGS. 8 to 16 moreover exemplify the possibility of mounting onto structure L, in addition to the light radiation sources L, other electrical/electronic components/circuits, denoted by references such as C, C1, C2, C3, having the properties either of a resistor (optionally a zero-Ohm resistor, merely serving as interconnection bridge) or of more complex circuits (such as e.g. drivers), adapted to be arranged on respective portions in the network of electrically-conductive ink 20 as a function of the specific application and usage needs.

Moreover, the possibility is given of using the power supply provided by the lines 14 arranged on the opposite surface of substrate 12 through the lands 16.

As regards the connection of the electrical module (see for example any of the embodiments exemplified in FIGS. 3 to 7) to the corresponding power supply (Electronic Control Gear—ECG, not visible in the drawings) it is possible to resort to dedicated connectors of various types.

Figure 12:
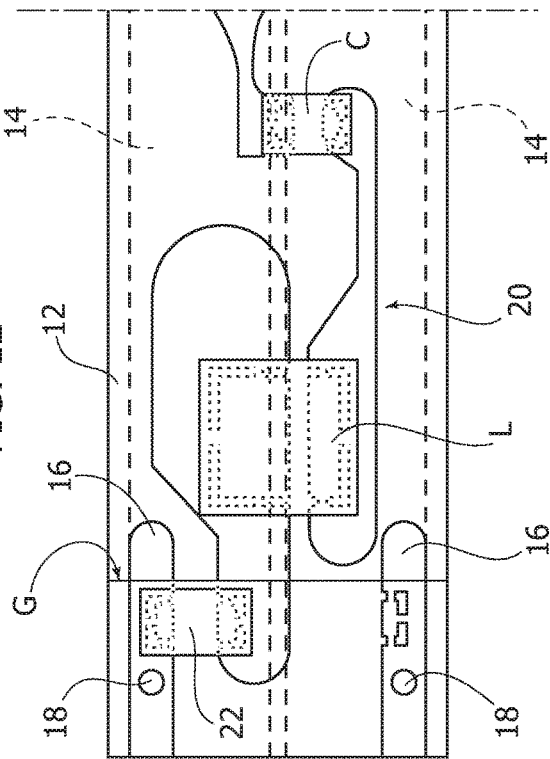
FIG. 12 shows further usages of embodiments, FIG. 13 exemplifies possible applications of one or more embodiments.

There may be provided connectors G adapted to establish an electrical contact:
as exemplified in FIG. 12, on the back or bottom side of structure 10, with the formations 14, and/or
as exemplified in FIGS. 13 to 16, on the front or top side of structure 10, the formations 20 being implemented by means of conductive ink deposition and/or—optionally—by means of the lands 16.

In this case, the contact pads for the power supply connectors may be connected to the formations 14 on the back (bottom) surface of structure 10, e.g. by using the connection procedure as exemplified e.g. in FIGS. 3 to 7 or in FIGS. 8 and 9.

Figures such as FIGS. 3 to 7 further exemplify the possibility of arranging connectors G practically at the ends of each SEU, which may be obtained by cutting to length structure 10 (virtually of indefinite length) or, at least theoretically, also at intermediate points of an individual module.

Such connectors G may be provided with sliding contacts, adapted to establish a surface contact with formations 14, 16, 20, e.g. in the case of bare, i.e. uncoated, modules.

In the case of "protected" lighting modules, which are coated with a protective, e.g. polymer, material, in order to obtain a protection degree against the penetration of external agents (having e.g. an IP protection degree), connectors G may be provided with perforating contacts, adapted to establish a contact with the formations 14, 16, 20 by piercing said protective coating.

In one or more embodiments, a support structure (e.g. 10) for electrically-powered lighting devices may include:
an elongated laminar substrate (e.g. 12) having first and second mutually opposed surfaces,
a layer of electrically-conductive material on the first surface of the laminar substrate, the layer including etching forming first electrically-conductive formations (e.g. 14) extending along the first surface of the laminar substrate,
a distribution of electrically-conductive areas (e.g. 16) on the second surface of the laminar substrate, the distribution including electrically-conductive areas, formed by means of etching, distributed with a constant separation pitch along the second surface of the laminar substrate,
electrically-conductive vias (e.g. 18) extending through the laminar substrate to connect said first electrically-conductive formations and electrically-conductive areas in said distribution, and
a network of second electrically-conductive formations (e.g. 20) including electrically-conductive ink deposited on the second surface of the laminar substrate (12), with second electrically-conductive formations in said network being electrically connected (e.g. 20a, 22) with electrically-conductive areas in said distribution.

In one or more embodiments:
the laminar substrate may include a ribbon-like substrate having opposite sides, and
the distribution of electrically-conductive areas may include pairs of areas distributed with a constant separation pitch along the second surface of the laminar substrate, each pair including mutually opposed electrically-conductive areas positioned at said opposite sides of the laminar substrate.

One or more embodiments may include extensions (e.g. 20a) of second electrically-conductive formations (20) in said network extending over electrically-conductive areas (16) in said distribution, to facilitate electrical connection therewith.

One or more embodiments may include electrically-conductive elements (e.g. 22) extending bridge-like between second electrically-conductive formations (20) in said network and electrically-conductive areas in said distribution, to facilitate electrical connection therebetween.

In one or more embodiments, second electrically-conductive formations in said network may include mounting lands for electrical components and/or circuits (e.g. L, D, C, C1, C2).

A lighting device according to one or more embodiments may include:
a support structure according to one or more embodiments, and
at least one electrically-powered light radiation source (e.g. L), the at least one electrically-powered light radiation source being electrically coupled with second electrically-conductive formations in said network.

In one or more embodiments, the at least one light radiation source may include a LED source.

A method of using a support structure according to one or more embodiments may include cutting to length said support structure at at least one of said electrically-conductive areas distributed with a constant separation pitch along the second surface of the laminar substrate, in order to form an end portion of the structure.

One or more embodiments may include mounting on said support structure at least one electrically-powered light radiation source, the at least one electrically-powered light radiation source being electrically coupled with second electrically-conductive formations in said network.

One or more embodiments may include cutting said support structure with said at least one light radiation source mounted thereon.

One or more embodiments may include coupling an electrical connector (G) with said end portion formed in said structure.

One or more embodiments may include providing said electrical connector with:
sliding contacts adapted to come into surface contact with electrically-conductive formations on said substrate, or
perforating contacts adapted to perforate a protective layer of said structure, to come into contact with electrically-conductive formations on said substrate.

Without prejudice to the basic principles, the implementation details and the embodiments may vary, even appreciably, with respect to what has been described herein by way of non-limiting example only, without departing from the extent of protection.

The extent of protection is defined by the annexed claims.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A support structure for electrically-powered lighting devices, the structure comprising:
an elongated laminar substrate having first and second opposed surfaces,
a layer of electrically-conductive material on the first surface of the laminar substrate, the layer including etching forming first electrically-conductive formations extending along the first surface of the laminar substrate,
a distribution of electrically-conductive areas on the second surface of the laminar substrate, the distribution including electrically-conductive areas formed via etching distributed with a constant separation pitch along the second surface of the laminar substrate,
electrically-conductive vias extending through the laminar substrate to connect the first electrically-conductive formations and electrically-conductive areas in said distribution, and
a network of second electrically-conductive formations including electrically-conductive ink deposited on the second surface of the laminar substrate, with second electrically-conductive formations in said network electrically connected with electrically-conductive areas in said distribution.

2. The support structure of claim 1,
wherein the laminar substrate includes a ribbon-like substrate having opposite sides, and
the distribution of electrically-conductive areas includes pairs of areas distributed with a constant separation pitch along the second surface of the laminar substrate, each pair including mutually opposed electrically-conductive areas positioned at said opposite sides of the laminar substrate.

3. The support structure of claim 1, further comprising extensions of second electrically-conductive formations in said network extending over electrically-conductive areas in said distribution to facilitate electrical connection therewith.

4. The support structure of claim 1, further comprising electrically-conductive elements extending bridge-like between second electrically-conductive formations in said network and electrically-conductive areas in said distribution to facilitate electrical connection therebetween.

5. The support structure of claim 1, wherein the second electrically-conductive formations in said network include mounting lands for electrical components and/or circuits (L, D, C, C1, C2).

6. A lighting device, comprising:
a support structure comprising:
an elongated laminar substrate having first and second opposed surfaces,
a layer of electrically-conductive material on the first surface of the laminar substrate, the layer including etching forming first electrically-conductive formations extending along the first surface of the laminar substrate,
a distribution of electrically-conductive areas on the second surface of the laminar substrate, the distribution including electrically-conductive areas formed via etching distributed with a constant separation pitch along the second surface of the laminar substrate, electrically-conductive vias extending through the laminar substrate to connect the first electrically-conductive formations and electrically-conductive areas in said distribution, and a network of second electrically-conductive formations including electrically-conductive ink deposited on the second surface of the laminar substrate, with second electrically-conductive formations in said network electrically connected with electrically-conductive areas in said distribution; and at least one electrically-powered light radiation source, the at least one electrically-powered light radiation source electrically coupled with second electrically-conductive formations in said network.

7. The lighting device of claim 6, wherein the at least one light radiation source includes a LED source.

8. A method of using a support structure, the support structure comprising:

an elongated laminar substrate having first and second opposed surfaces, a layer of electrically-conductive material on the first surface of the laminar substrate, the layer including etching forming first electrically-conductive formations extending along the first surface of the laminar substrate, a distribution of electrically-conductive areas on the second surface of the laminar substrate, the distribution including electrically-conductive areas formed via etching distributed with a constant separation pitch along the second surface of the laminar substrate, electrically-conductive vias extending through the laminar substrate to connect the first electrically-conductive formations and electrically-conductive areas in said distribution, and a network of second electrically-conductive formations including electrically-conductive ink deposited on the second surface of the laminar substrate, with second electrically-conductive formations in said network electrically connected with electrically-conductive areas in said distribution;

the method comprising:

cutting to length said support structure at at least one of said electrically-conductive areas distributed with a constant separation pitch along the second surface of the laminar substrate to form an end portion of the structure.

9. The method of claim 8, further comprising mounting on said support structure at least one electrically-powered light radiation source the at least one electrically-powered light radiation source electrically coupled with second electrically-conductive formations said network.

10. The method of claim 8, further comprising cutting said support structure with said at least one light radiation source mounted thereon.

11. The method of claim 8, further comprising coupling an electrical connector with said end portion formed in said structure.

12. The method of claim 11, further comprising providing said electrical connector with:

sliding contacts adapted to come into surface contact with electrically-conductive formations on said substrate, or perforating contacts adapted to perforate a protective layer of said structure to come into contact with electrically-conductive formations on said substrate.

* * * * *